(12) United States Patent
Kim et al.

(10) Patent No.: US 12,466,936 B2
(45) Date of Patent: Nov. 11, 2025

(54) RESIN COMPOSITION FOR SEMICONDUCTOR PACKAGE, RESIN COATED COPPER, AND CIRCUIT BOARD COMPRISING SAME

(71) Applicant: LG INNOTEK CO., LTD., Seoul (KR)

(72) Inventors: Yong Suk Kim, Seoul (KR); Jeong Han Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 314 days.

(21) Appl. No.: 18/265,393

(22) PCT Filed: Dec. 3, 2021

(86) PCT No.: PCT/KR2021/018247
§ 371 (c)(1),
(2) Date: Jun. 5, 2023

(87) PCT Pub. No.: WO2022/119389
PCT Pub. Date: Jun. 9, 2022

(65) Prior Publication Data
US 2024/0059863 A1    Feb. 22, 2024

(30) Foreign Application Priority Data

Dec. 3, 2020  (KR) ......................... 10-2020-0167759
Dec. 21, 2020 (KR) ......................... 10-2020-0179352

(51) Int. Cl.
*C08K 3/36*  (2006.01)
*C08J 5/24*  (2006.01)
(Continued)

(52) U.S. Cl.
CPC .................... *C08K 3/36* (2013.01); *C08J 5/24* (2013.01); *C08K 3/22* (2013.01); *H05K 1/0373* (2013.01);
(Continued)

(58) Field of Classification Search
CPC ....................................................... C08K 3/36
(Continued)

(56) References Cited

U.S. PATENT DOCUMENTS

2007/0020803 A1   1/2007  Saigoh et al.
2016/0177024 A1*  6/2016  Nishiyama ............. B32B 37/06
                                                       428/339

(Continued)

FOREIGN PATENT DOCUMENTS

JP        4890804 B2       3/2012
KR   10-2010-0096910 A     9/2010
(Continued)

*Primary Examiner* — Stanley Tso
(74) *Attorney, Agent, or Firm* — Birch, Stewart, Kolasch & Birch, LLP

(57) ABSTRACT

A resin composition for a semiconductor package according to an embodiment includes a resin composition that is a composite of a resin and a filler disposed in the resin, wherein the filler has a content in a range of 68 wt % to 76 wt % in the resin composition, wherein the filler includes a first filler group composed of fillers having a first diameter; a second filler group composed of fillers having a second diameter smaller than the first diameter; and a third filler group composed of fillers having a third diameter smaller than the second diameter, and contents of each of the first filler group, the second filler group, and the third filler group in the filler are different from each other.

17 Claims, 9 Drawing Sheets

(51) Int. Cl.
*C08K 3/22* (2006.01)
*H05K 1/03* (2006.01)

(52) U.S. Cl.
CPC ........ *C08J 2327/18* (2013.01); *C08J 2361/06* (2013.01); *C08J 2363/00* (2013.01); *C08K 2003/2227* (2013.01); *C08K 2003/2241* (2013.01); *C08K 2003/2244* (2013.01); *C08K 2201/003* (2013.01); *H05K 2201/0263* (2013.01)

(58) Field of Classification Search
USPC .......................................................... 174/255
See application file for complete search history.

(56) References Cited

U.S. PATENT DOCUMENTS

| | | |
|---|---|---|
| 2016/0353570 A1 | 12/2016 | Lee |
| 2017/0033063 A1 | 2/2017 | Lin et al. |
| 2021/0313274 A1* | 10/2021 | Park ................. H01L 24/24 |
| 2023/0182443 A1* | 6/2023 | Lee ................ H05K 1/0373 |
| | | 428/458 |

FOREIGN PATENT DOCUMENTS

| | | |
|---|---|---|
| KR | 10-2011-0001186 A | 1/2011 |
| KR | 10-2012-0048984 A | 5/2012 |
| KR | 10-2014-0134087 A | 11/2014 |
| KR | 10-2016-0024917 A | 3/2016 |
| KR | 10-2016-0140258 A | 12/2016 |
| KR | 10-1786217 B1 | 10/2017 |
| KR | 10-2019-0023297 A | 3/2019 |

\* cited by examiner

[FIG. 1]
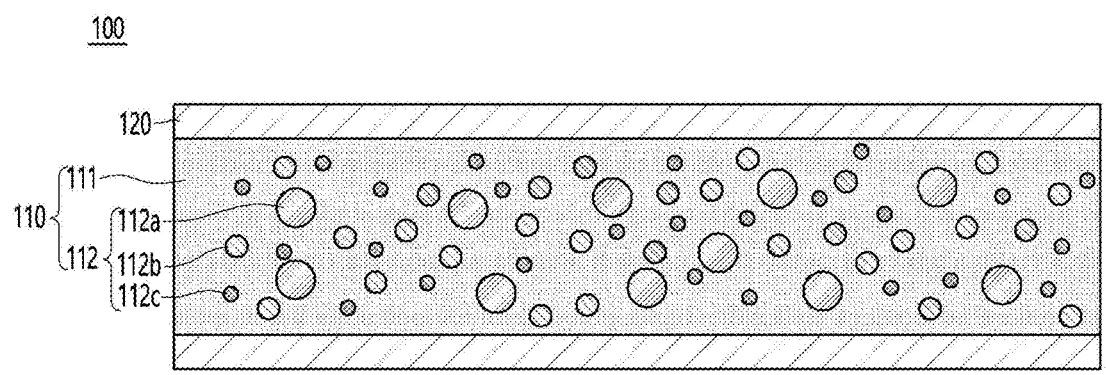

[FIG. 2]
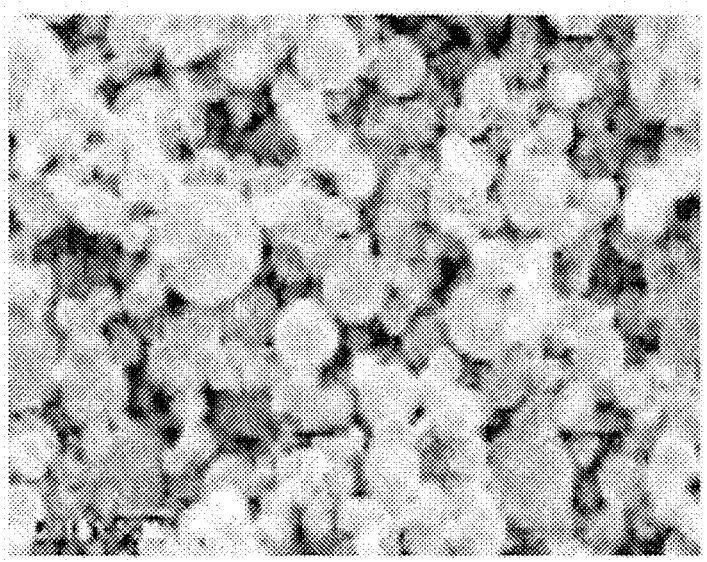
(a)
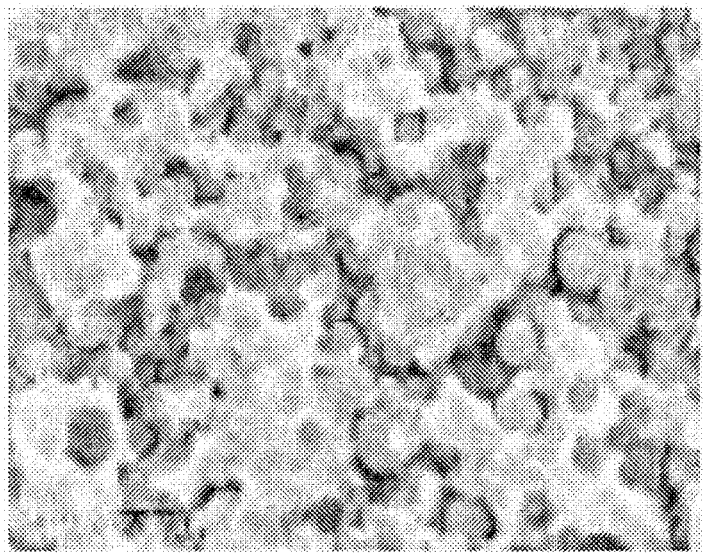
(b)

[FIG. 3]
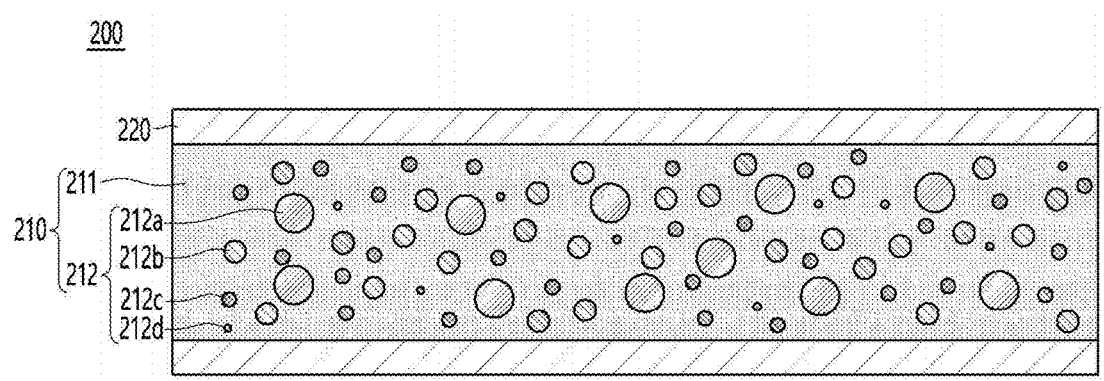

[FIG. 4]
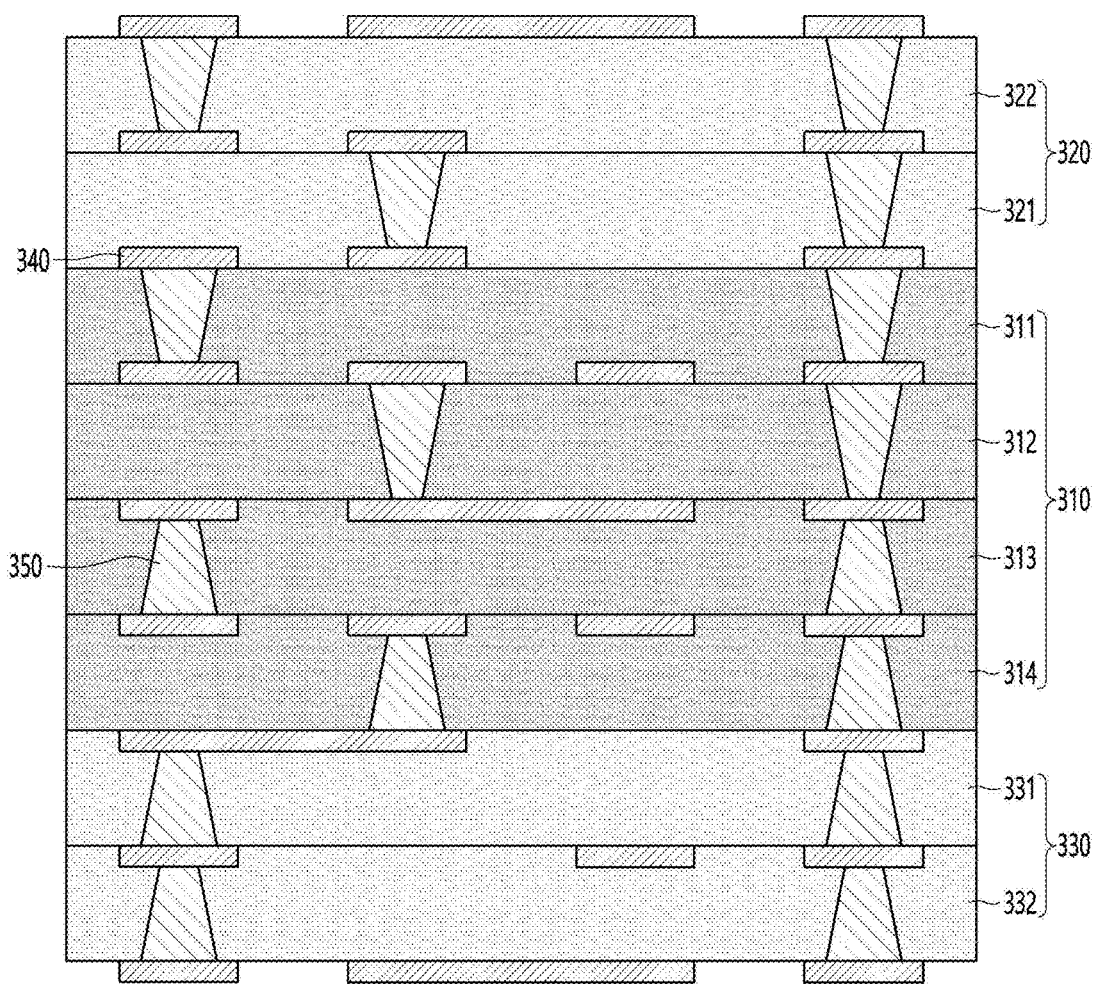

[FIG. 5]
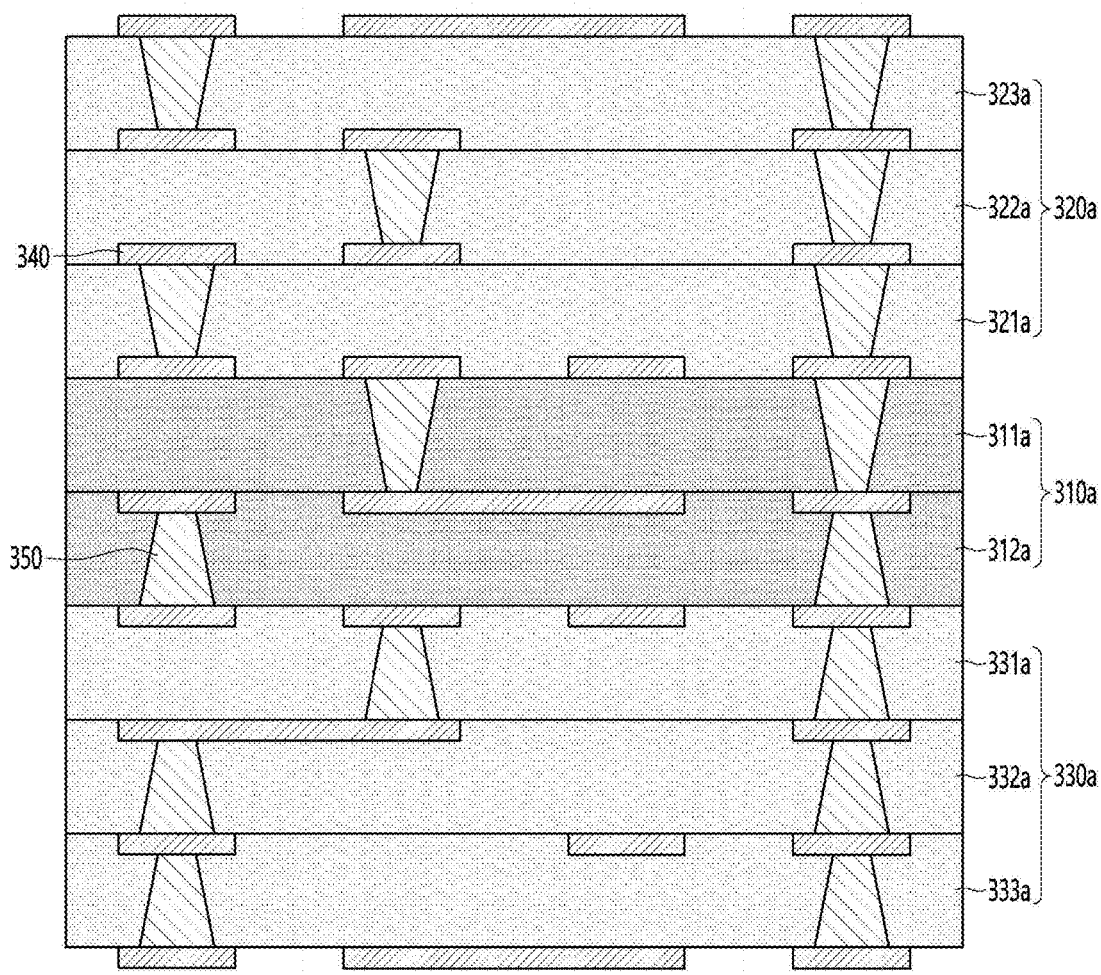

[FIG. 6]
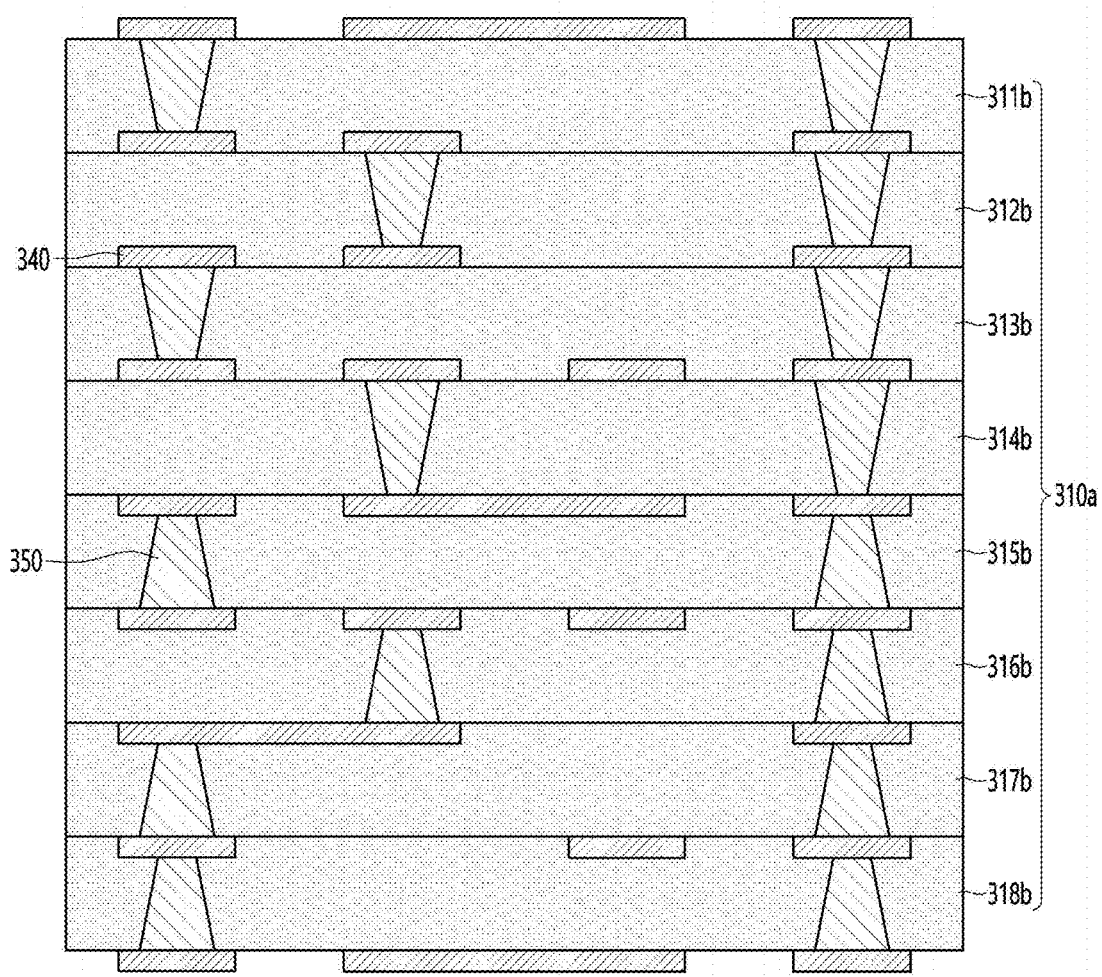

[FIG. 7]
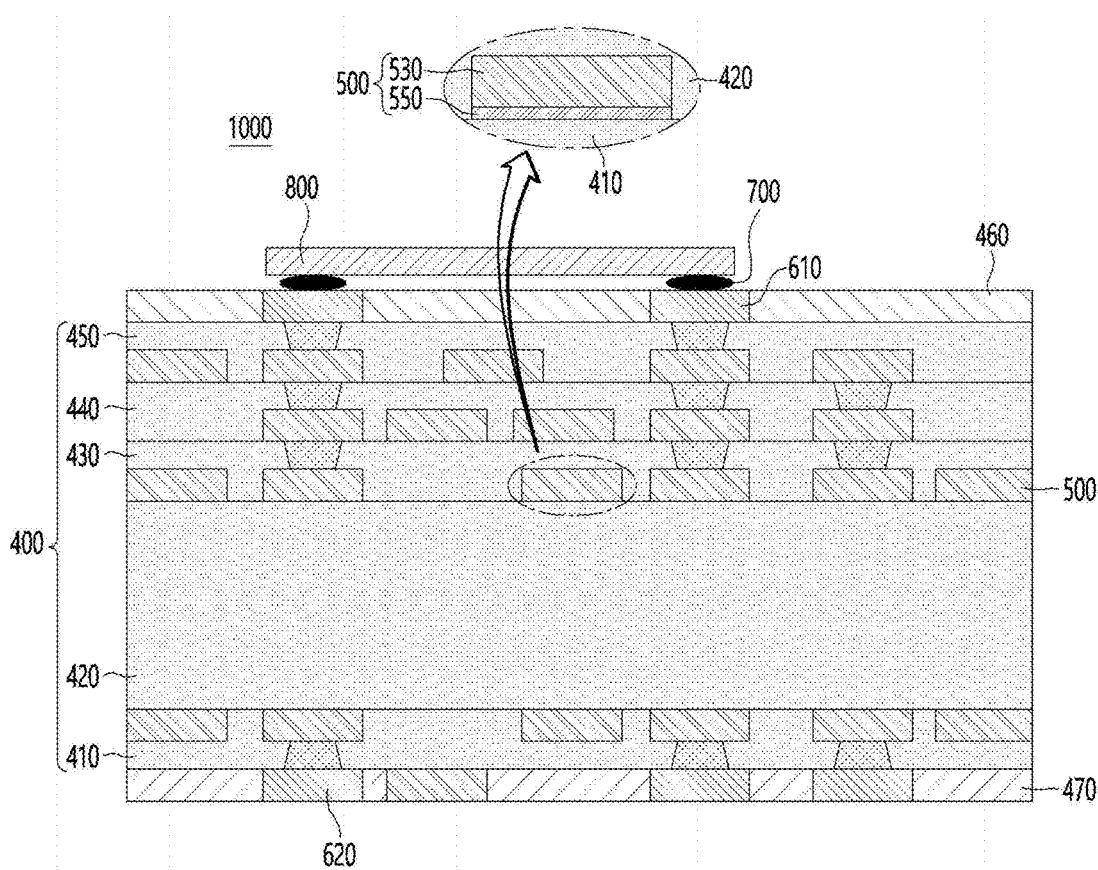

[FIG. 8]
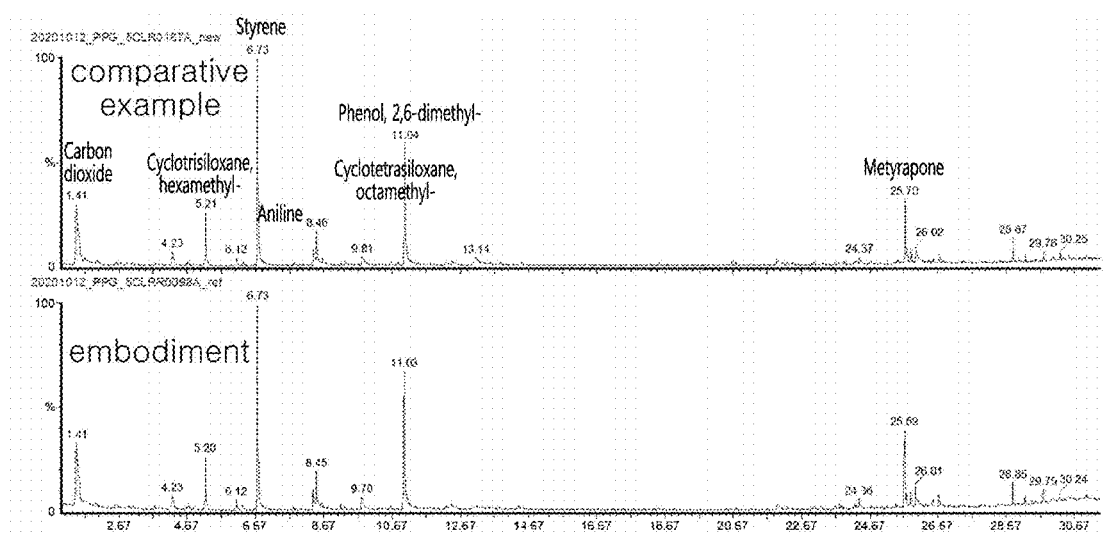

[FIG. 9]
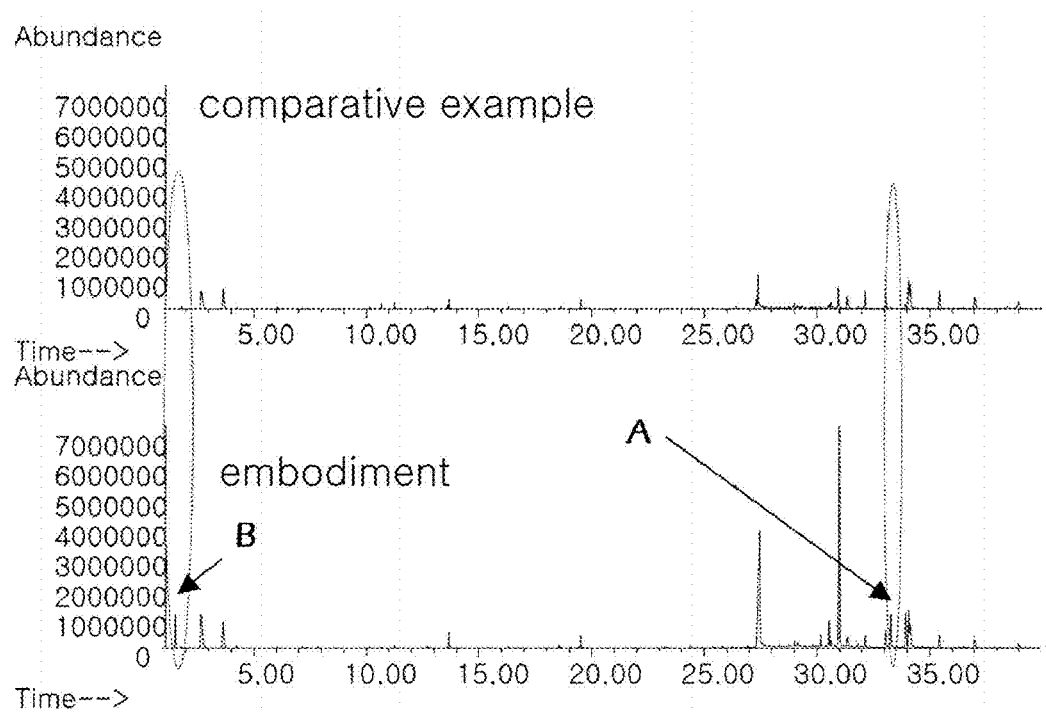

RESIN COMPOSITION FOR SEMICONDUCTOR PACKAGE, RESIN COATED COPPER, AND CIRCUIT BOARD COMPRISING SAME

CROSS REFERENCE TO RELATED APPLICATIONS

This application is the National Phase of PCT International Application No. PCT/KR2021/018247, filed on Dec. 3, 2021, which claims priority under 35 U.S.C. 119 (a) to Patent Application No. 10-2020-0167759, filed in the Republic of Korea on Dec. 3, 2020 and Patent Application No. 10-2020-0179352, filed in the Republic of Korea on Dec. 21, 2020, all of which are hereby expressly incorporated by reference into the present application.

TECHNICAL FIELD

The embodiment relates to a resin composition for a semiconductor package, and in particular, to a resin composition for a semiconductor package having a low dielectric constant, a resin coated copper, and a circuit board comprising the same.

BACKGROUND ART

A printed circuit board (PCB) is formed by printing a circuit line pattern on an electrically insulating substrate with a conductive material such as copper, and refers to a board immediately before mounting electronic components. That is, in order to densely mount many types of electronic devices on a flat plate, it means a circuit board on which a mounting position of each part is determined and a circuit pattern connecting the parts is printed on the flat plate surface and fixed.

Components mounted on the printed circuit board may transmit a signal generated from the component by a circuit pattern connected to each component.

On the other hand, recent portable electronic devices and the like are becoming highly functional, in order to perform high-speed processing of large amounts of information, high-frequency signals are being developed, and accordingly, there is a demand for a circuit pattern of a printed circuit board suitable for high-frequency applications.

The circuit pattern of the printed circuit board should minimize signal transmission loss and enable signal transmission without deteriorating the quality of the high-frequency signal.

The transmission loss of a circuit pattern of a printed circuit board mainly consists of a conductor loss due a metal thin film such as copper and a dielectric loss such as an insulating layer.

The conductor loss due to the metal thin film is related to a surface roughness of the circuit pattern. That is, as the surface roughness of the circuit pattern increases, transmission loss may increase due to a skin effect.

Accordingly, when the surface roughness of the circuit pattern is reduced, there is an effect of preventing a reduction in transmission loss, but there is a problem in that the adhesion between the circuit pattern and the insulating layer is reduced.

In addition, a material having a low dielectric constant may be used as an insulating layer of the circuit board in order to reduce a dielectric constant.

However, in the circuit board for high frequency applications, the insulating layer requires chemical and mechanical properties for use in the circuit board in addition to the low dielectric constant.

In details, it should have isotropy of electrical properties for ease of circuit pattern design and process, low reactivity with metal wiring materials, low ionic conductivity, sufficient mechanical strength to withstand processes such as chemical mechanical polishing (CMP), low moisture absorption, which can prevent delamination or increase in dielectric constant, heat resistance that can overcome the processing temperature, a low coefficient of thermal expansion to eliminate cracking due to temperature change, and furthermore, various conditions such as adhesion, crack resistance, low stress, and low high-temperature gas generation to minimize various stresses and peeling that may be generated at the interface with other materials must be satisfied.

In addition, the insulating layer used in the circuit board for high-frequency applications must satisfy various conditions such as an adhesion property that can minimize various stresses and peeling that can occur at interfaces with other materials (eg, metal thin films), a crack resistance property, a low stress property, a low high-temperature gas generation property.

Accordingly, the insulating layer used in the circuit board for high frequency use preferentially must have low dielectric constant and low thermal expansion coefficient properties, and accordingly, an overall thickness of the circuit board can be reduced.

However, when a circuit board is manufactured using an insulating layer of a low dielectric constant material that is thinner than a threshold, it causes reliability problems such as warping, cracking and delamination, and this increases the degree of reliability problems such as bending, cracking, and peeling as the number of layers of the insulating layer of the low dielectric material increases. In particular, in the case of an insulating layer containing a high content of filler, the filler is exposed to a surface of the insulating layer, an electrochemical migration (ECM) phenomenon may occur as the exposed filler contacts the metal layer, thereby reducing reliability of the circuit board. Here, the electrochemical migration refers to a phenomenon in which a filler is adsorbed between two electrically insulated metal patterns and becomes electrochemically unstable when a voltage is applied, and conductive filaments or dendrites are formed between the two metal patterns, causing an electrical short.

Furthermore, an insulating layer having a low dielectric material or a nonpolar molecular structure with many pores is applied to a circuit board for high frequency applications. However, there is a problem that the adhesion between the insulating layer and the circuit pattern decreases due to the nonpolar molecular structure and pores.

Therefore, in a circuit board composed of an insulating layer containing a high content of filler, a method is required to solve the electrochemical migration phenomenon by minimizing the exposure of the filler and to solve the adhesion problem between the insulating layer and the circuit pattern.

DISCLOSURE

Technical Problem

The embodiment provides a resin composition for a semiconductor package with improved reliability, a resin coated copper and a circuit board comprising the same.

In addition, the embodiment provides a resin composition for a semiconductor package having a low dielectric constant and a low coefficient of thermal expansion, a resin coated copper and a circuit board comprising the same.

In addition, the embodiment provides a resin composition for a semiconductor package, a resin coated copper and a circuit board comprising the same that can solve the electrochemical migration phenomenon caused by contact with a metal layer by preventing exposure of fillers in an insulating layer.

In addition, the embodiment provides a resin composition for a semiconductor package with improved adhesion, reliability, and low loss of high-frequency signals, a resin coated copper and a circuit board comprising the same.

The technical problems to be achieved in the proposed embodiment are not limited to the technical problems mentioned above, and other technical problems not mentioned in the embodiments will be dearly understood by those of ordinary skill in the art to which the embodiments proposed from the description below.

Technical Solution

A resin composition for a semiconductor package according to an embodiment comprises a resin composition that is a composite of a resin and a filler disposed in the resin, wherein the filler has a content in a range of 68 wt % to 76 wt % in the resin composition, wherein the filler includes a first filler group composed of fillers having a first diameter; a second filler group composed of fillers having a second diameter smaller than the first diameter; and a third filler group composed of fillers having a third diameter smaller than the second diameter, wherein contents of each of the first filler group, the second filler group, and the third filler group in the filler are different from each other.

In addition, the first diameter has a range between 2 μm and 3.5 μm, the second diameter has a range between 1 μm and 2 μm, and the third diameter has a range between 0.5 μm and 1 μm.

In addition, the first filler group in the filler is included in a range of 5 wt % to 20 wt %, the second filler group is included in a range of 60 wt % to 80 wt %, and the third filler group is included in a range of 10 wt % to 30 wt %.

In addition, the filler includes a fourth filler group composed of fillers having a fourth diameter smaller than the third diameter.

In addition, the fourth diameter has a range between 0.1 pry and 0.5 μm.

In addition, the first filler group in the filler is included in a range of 1 wt % to 15 wt %, the second filler group is included in a range of 50 wt % to 70 wt %, the third filler group is included in a range of 15 wt % to 356 wt %, and the fourth filler group is included in a range of 5 wt % to 20 wt %.

In addition, a dielectric constant of the resin composition has a range between 2.9 and 3.2 by a combination of the resin and the filler.

Meanwhile, a resin coated copper according to an embodiment may be prepared by laminating or compressing copper foil on one or both sides of the resin composition for the semiconductor package.

Meanwhile, a circuit board according to an embodiment may comprise a plurality of insulating layers; and a circuit pattern disposed on a surface of at least one insulating layer among the plurality of insulating layers; and a via passing through at least one insulating layer among the plurality of insulating layers; and wherein at least one of the plurality of insulating layers includes the resin coated copper.

In addition, all of the plurality of insulating layers are composed of the resin coated copper.

In addition, the plurality of insulating layers may include a first insulating part including at least one insulating layer; a second insulating part disposed on the first insulating part and including at least one insulating layer; and a third insulating part disposed below the first insulating part and including at least one insulating layer; wherein an insulating layer constituting the first insulating part may include prepreg, and each insulating layer constituting the second insulating part and the third insulating part may include the resin coated copper.

Meanwhile, a resin composition for a semiconductor package according to an embodiment includes an epoxy resin, a curing agent, and an additive agent, and the additive agent includes a first functional group, and the first functional group includes at least one of —COOH, —NH2, —OH, —OCl, and —OBr.

In addition, the additive agent is represented by the following chemical formula.

[chemical formula]

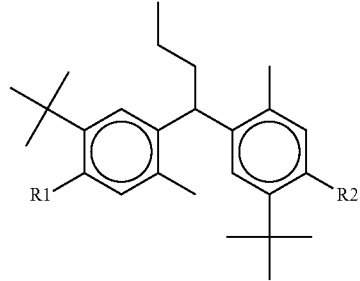

In addition, the additive agent is included in a range of 1 wt % to 10 wt % of a wt % of the epoxy resin.

Meanwhile, a circuit board of another embodiment comprises a plurality of substrates sequentially laminated; and a circuit pattern disposed on at least one surface of each substrate, wherein the substrate is formed of a resin composition for a semiconductor package, the resin composition for the semiconductor package includes a first functional group, the circuit pattern includes a metal layer and a buffer layer disposed on at least one surface of the metal layer, the buffer layer includes a second functional group and a third functional group, and wherein the first functional group and the second functional group are bonded through a condensation reaction.

In addition, the resin composition for the semiconductor package includes an epoxy resin, a curing agent, and an additive agent, and the first functional group includes at least one of —COOH, —NH2, —OH, —OCl, and —OBr.

In addition, the additive agent is represented by the following chemical formula.

[chemical formula]

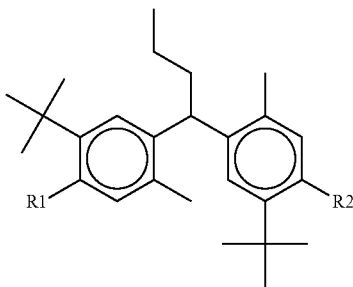

In addition, the additive agent is included in a range of 1 wt % to 10 wt % of a wt % of the epoxy resin.

In addition, the buffer layer is disposed to a thickness of 5 nm to 500 nm.

In addition, the third functional group coordinates with the metal layer.

In addition, the third functional group includes a Si group and a thiocyanate group (—SON) of silane groups.

In addition, the buffer layer includes a carbon element, a nitrogen element, an oxygen element, a silicon element, a sulfur element, and a metal element, wherein a ratio of the carbon element to the metal element ((carbon element/copper element)*100) is 5 to 7, a ratio of the nitrogen element to the metal element ((nitrogen element/copper element)*100) is 1.5 to 7, a ratio of the oxygen element to the metal element ((oxygen element/copper element)*100) is 1.1 to 1.9, a ratio of the silicon element to the metal element ((silicon element/copper element)*100) is 0.5 to 0.9 and a ratio of the sulfur element to the metal element ((sulfur element/copper element)*100) is 0.5 to 1.5.

Advantageous Effects

The embodiment provides a resin composition for a semiconductor package constituting an insulating layer or an insulating film, which is a composite of resin and filler. In this case, the filler of the embodiment may include at least three filler groups having different diameter ranges. Accordingly, the embodiment can expand the resin coverage by diversifying the filler size, and it may minimize contact between the filler and the metal layer. In addition, the embodiment can prevent a migration phenomenon by minimizing contact between the filler and the metal layer, thereby improving reliability.

Accordingly, the embodiment may allow to provide an insulating layer using a resin coated copper having a low dielectric constant, and accordingly, it is possible to provide a highly reliable circuit board in which signal loss is minimized even in a high frequency band while reducing the thickness of the circuit board.

In addition, the resin composition for the semiconductor package of the embodiment forms a substrate applied to a circuit board, and the substrate formed by the resin composition for the semiconductor package may include a first functional group. In addition, the circuit pattern disposed on the substrate includes a metal layer and a buffer layer, and the buffer layer may include a second functional group and a third functional group that bond with the substrate and the metal layer.

Accordingly, the first functional group of the substrate and the second functional group of the buffer layer are chemically bonded through a condensation reaction, and the third functional group of the buffer layer may be chemically bonded to a metal of the metal layer through a coordination bond. Accordingly, the substrate and the buffer layer are chemically bonded through a covalent bond, and the buffer layer and the metal layer may be chemically bonded through a coordination bond, thereby improving adhesion between the substrate and the circuit pattern of the circuit board. In addition, even if an additive agent having the first functional group is introduced into a resin composition for a semiconductor package in order to introduce the first functional group, the substrate can have a low dielectric constant, so that the circuit board according to the embodiment may be applied to a high-frequency electronic signal. In addition, even if an additive agent having the first functional group is introduced into a resin composition for a semiconductor package to introduce the first functional group, since the coefficient of thermal expansion and glass transition temperature of the substrate are maintained, the heat resistance of the circuit board can be maintained. In addition, when an additive agent having the first functional group is introduced into the resin composition for a semiconductor package in order to introduce the first functional group, it is possible to improve the durability of the board and improve the reliability of the circuit board.

DESCRIPTION OF DRAWINGS

FIG. 1 is a view illustrating a resin coated copper according to a first embodiment, FIG. 2 is a view illustrating a change in interface of insulating layers of an embodiment and a comparative example after de-smearing.

FIG. 3 is a view illustrating a ruin coated copper according to a second embodiment.

FIG. 4 is a view illustrating a circuit board according to a first embodiment.

FIG. 5 is a view illustrating a circuit board according to a second embodiment.

FIG. 6 is a view illustrating a circuit board according to a third embodiment.

FIG. 7 is a view illustrating a ci board according to a fourth embodiment.

FIG. 8 is a view illustrating a py-GC/MS analysis of a resin composition for a semiconductor package according to a fourth embodiment and a comparative example before adding an additive agent.

FIG. 9 is a view illustrating a TD-GC/MS analysis of an additive agent of a resin composition for a semiconductor package according to a fourth embodiment and a comparative example after adding an additive agent.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

In an embodiment, a resin composition for a semiconductor package may be a composite of a resin and a filler. The resin composition for a semiconductor package may have a resin and a structure in which a predetermined content of filler is dispersed in the resin.

In addition, in an embodiment, a copper foil layer may be laminated and pressed on at least one surface of the resin composition for the semiconductor package composed of a composite of the resin and the filler to manufacture a resin coated copper (RCC).

Accordingly, the resin coated copper in the embodiment may include an insulating film (or insulating layer) composed of a composite of the resin and the filler and the copper foil layer laminated or compressed on at least one surface of the insulating film.

Hereinafter, a resin coated copper including an insulating film (or insulating layer) and a copper foil layer having a low dielectric constant and a low coefficient of thermal expansion according to an embodiment will be described. However, the embodiment is not limited thereto, and the insulating film constituting the copper foil adhesion resin may also be used as an ABF (Ajinomoto Build-up Film).

FIG. 1 is a view illustrating a resin coated copper according to a first embodiment, and FIG. 2 is a view illustrating a change in interface of insulating layers of an embodiment and a comparative example after de-smearing.

Referring to FIGS. 1 and 2, the resin coated copper according to a first embodiment includes an insulating film (110, or an insulating layer or a resin composition for a semiconductor package) and a copper foil layer 120 disposed on at least one surface of the insulating film 110. The insulating film 110 may also be referred to as an insulating layer, Hereinafter, the insulating film will be described as the insulating layer 110 for convenience of explanation.

The insulating layer 110 may include a resin 111 and a filler 112 dispersed in the resin 111. The insulating layer 110 may be a resin for a semiconductor package. The embodiment allows the dielectric constant of the insulating layer 110 to be lowered to 3.2 Dk or less through a change in the content of the composition in the insulating layer 110 constituting the resin for the semiconductor package. Preferably, the embodiment allows the dielectric constant of the insulating layer 110 to be lowered to 3.0 Dk or less through a change in the content of the composition in the insulating layer 110 constituting the resin for the semiconductor package. More preferably, the embodiment allows the dielectric constant of the insulating layer 110 to satisfy a range of 2.9 Dk to 3.2 Dk through a change in the content of the composition in the insulating layer 110 constituting the resin for the semiconductor package. Hereinafter, a resin for a semiconductor package is referred to as an insulating layer 110, and a resin composition for a semiconductor package corresponding to the insulating layer 110 will be described.

The insulating layer 110 is a composite of a resin 111 and a filler 112. The insulating layer 110 may have a specific third dielectric constant due to a combination of a first dielectric constant of the resin 111 and a second dielectric constant of the filler 112. In addition, the third dielectric constant may satisfy a range of 2.9 Dk to 3.2 Dk. Accordingly, the insulating layer 110 in the embodiment can be applied to a circuit board suitable for high frequency applications. Accordingly, the embodiment can minimize signal loss by the insulating layer 110 and solve the problem of exposing the filler 112 to the surface of the resin 111, and accordingly, the embodiment allows for improved reliability.

The resin 111 may have a low dielectric constant.

In this case, Table 1 shows a type of general resin and a dielectric constant according to the type of resin.

TABLE 1

| | material | | | | |
|---|---|---|---|---|---|
| | Phenolic | Epoxy | Maleimide or modify epoxy | Cyanate | PTFE |
| dielectric constant (Dk) | 4.5~6.5 | 3.5~5.0 | 2.3~2.5 | 2.6~3.0 | 2.2 |

As described above, the resin may include various materials. In this case, the resin including phenolic, general epoxy, and cyanate has a dielectric constant (Dk) of 2.6 or more.

In addition, the resin including PTFE has a low dielectric constant of about 2.2 Dk, but a high process temperature condition is required. For example, a resin generally requires a process temperature of 250° C., but the PTFE requires a process temperature of 300° C. or more. In addition, the PTFE requires a bonding sheet during the lamination process to manufacture a multi-layered circuit board, which increases the overall thickness of the circuit board, causing problems in summing the circuit board.

Accordingly, the embodiment allows the dielectric constant of the resin 111 of the insulating layer 110 to be lowered by using a modified epoxy or a maleimide series. However, the embodiment is not limited thereto, and the dielectric constant may be made including general epoxy or cyanate.

In addition, the filler 112 may have a certain level of dielectric constant. For example, the filler 112 may be formed of a ceramic filler. In this case, Table 2 shows the dielectric constant according to the type of ceramic filler.

TABLE 2

| | material | | | | |
|---|---|---|---|---|---|
| | $SiO_2$ | $Al_2O_3$ | $ZrO_3$ | $HfO_2$ | $TiO_2$ |
| dielectric constant (Dk) | 3.7~4.2 | 9.0 | 3.7~4.2 | 3.7~4.2 | 3.7.2 |

As described above, when the filler 112 is formed of $Al_2O_3$, the dielectric constant of the filler 112 is about 9.0 Dk, and accordingly, there is a limit to lowering the dielectric constant of the insulating layer 110, which is a composite of resin and filler, to 3.2 Dk or less only with the dielectric constant of the resin 111. Therefore, in the embodiment, the filler 112 is constructed using any one of $SiO_2$, $ZrO_3$, $HfO_2$, and $TiO_2$.

Accordingly, the filler 112 may have a dielectric constant in a range of 3.7 to 4.2 Dk.

On the other hand, the filler 112 can be divided into a plurality of groups based on a diameter. For example, the filler 112 may be divided into at least three groups based on their diameters. For example, the filler 112 may include a first filler group 112a having a first diameter range, a second filler group 112b having a second diameter range smaller than the first diameter range, and a third filler group 112c having a third diameter range smaller than the second diameter range. Specifically, the filler 212 includes a first filler group 112a having a first diameter, a second filler group 112b having a second diameter smaller than the first diameter, and a third filler group 112c having a third diameter smaller than the second diameter. In addition, the first diameter of the first filler group 112a may satisfy the first diameter range. Also, the second diameter of the second filler group 112b may satisfy the second diameter range. Also, the third diameter of the third filler group 112c may satisfy the third diameter range.

That is, the insulating layer in the comparative example is composed of only fillers within a specific diameter range. However, in this case, it may be difficult to form the insulating layer depending on the diameter range of the filler, or the filler may be exposed to the surface of the insulating layer.

Accordingly, in the embodiment, when dispersing the filler 112 in the resin 111, the filler 112 is divided into at least three filler groups based on different diameter ranges, and the at least three filler groups are dispersed in the resin 111, Accordingly, the embodiment allows the insulating layer 110 to have a certain level of strength or higher while allowing the insulating layer 110 to have a low dielectric constant of 2.9 to 3.2 Dk. Furthermore, the embodiment minimizes the exposure of the filler 112 after de-smearing under the condition that the insulating layer 110 has the dielectric constant and strength within the above range, thereby minimizing migration growth.

In addition, the insulating layer 110 in the embodiment may have a coefficient of thermal expansion of 30 to 42 ppm.

To this end, the filler 112 may have a high content in the insulating layer 110. For example, a content of the filler 112 in the insulating layer 110 in the embodiment may be 68 wt % to 76 wt %. When the content of the filler 112 in the insulating layer 110 is smaller than 68 wt %, the insulating layer 110 may not have a certain level of strength or higher and may not have a coefficient of thermal expansion within the above range. In addition, when the content of the filler 112 in the insulating layer 110 is greater than 76 wt %, the insulating layer 110 may not have a low dielectric constant. Therefore, the embodiment allows the filler 112 in the insulating layer 110 to satisfy a range of 65 wt % to 76 wt %.

Meanwhile, in the embodiment, the fillers 112 may be divided into a plurality of groups having different diameter ranges. Also, a plurality of groups of the filler 112 may have different contents.

For example, the filler 112 may be divided into at least three filler groups having different diameter ranges.

Specifically, the filler 112 may include a first filler group 112a having a first diameter range. The first diameter range of the first filler group 112a may be 2 μm to 3.5 μm. A diameter of the first filler group 112a may be greater than a diameter of other filler groups constituting the filler 112. For example, the first filler group 112a may have a greatest diameter range among diameter ranges of at least three filler groups included in the filler 112.

The filler 112 may include a second filler group 112b having a second diameter range. The second diameter range of the second filler group 112b may be 1 μm to 2 μm. The second filler group 112b may be a filler group having a greatest content among filler groups constituting the filler 112. For example, the second filler group 112b may include fillers having a medium diameter range among a plurality of filler groups constituting the filler 112. In addition, the second filler group 112b having the medium diameter range may have a greatest content among the contents of each of the plurality of filler groups constituting the filler 112.

The filler 112 may include a third filler group 112c having a third diameter range. The third diameter range of the third filler group 112c may be 0.5 μm to 1 μm. The third filler group 112c of the first embodiment may include fillers with a smallest diameter range among a plurality of filler groups constituting the filler 112. The third filler group 112c may control a direction of resin flow in the insulating layer 110 while maintaining the dielectric constant that the insulating layer 110 should have within the content range of the filler 112.

For example, the filler 112 as described above includes a first filler group 112a, a second filler group 112b, and a third filler group 112c. In this case, the resin flow between the filler 112 including the plurality of filler groups may be regular. For example, the first filler group 112a in the embodiment has a greatest diameter range. Accordingly, the second filler group 112b and the third filler group 112c having a smaller diameter may be disposed between the fillers constituting the first filler group 112a. Therefore, in the embodiment, the resin flow may be performed along the second filler group 112b and the third filler group 112c between the first filler group 112a having the greatest diameter in a state where the filler 112 including a plurality of filler groups as described above is provided.

Unlike this, the comparative example includes fillers having one specific diameter range, and accordingly, the direction of the resin flow between the fillers in the comparative example may appear differently depending on a position.

The embodiment allows the first filler group 112a to be included in the filler 112 in a range of 5 wt % to 20 wt %. When the content of the first filler group 112a is less than 5 wt %, the insulating layer 110 may not have a certain level of rigidity. In addition, when the content of the first filler group 112a is greater than 20 wt %, it may cause a problem that the filler is exposed to the surface of the insulating layer 110 in the de-smear process due to the increase in the content of the first filler group 112a. In addition, it can cause migration growth.

In addition, the embodiment allow the second filler group 112b to be included in the filler 112 in a range of 60 wt % to 80 wt %, When the content of the second filler group 112b is less than 60 wt %, the insulating layer 110 may not have a certain level of rigidity. In addition, when the content of the second filler group 112b is greater than 80 wt %, the insulating layer 110 may not satisfy the required low dielectric constant. In addition, when the content of the second filler group 112b is greater than 80 wt %, it may cause a problem that the filler is exposed to the surface of the insulating layer 110 in the de-smear process.

In addition, the embodiment allows the third filler group 112c to have a content of 10 wt % to 30 wt % in the filler 112. When the content of the third filler group 112c is less than 10 wt %, the content of the first filler group 112a or the second filler group 112b should be increased by the decrease in the content of the third filler group 112c, and accordingly, a reliability problem may occur. In addition, when the content of the third filler group 112c is greater than 30 wt %, resin flowability may decrease as the content of the third filler group 112c increases.

As described above, the insulating layer 110 according to the first embodiment of the present application includes a resin 111 and a filler 112 dispersed in the resin 111. In addition, the filler 112 may be divided into a plurality of filler groups having different diameter ranges. Specifically, the filler 112 may be divided into at least three filler groups having different diameter ranges.

For example, the filler 112 may include a first filler group 112a having a first diameter range. For example, the filler 112 may include a second filler group 112b having a second diameter range smaller than the first diameter range. For example, the filler 112 may include a third filler group 112c having a third diameter range smaller than the second diameter range.

In addition, the first filler group 112a, the second filler group 112b, and the third filler group 112c may be dispersed and disposed in the resin 111 with different contents. Therefore, the embodiment expands the coverage of the resin by diversifying the diameter of the filler 112 as described above to prevent contact between the filler 112 and the copper foil layer. Specifically, the embodiment can expand the coverage of the resin through the diversification of the diameter of the filler 112, thereby preventing contact between the filler and the copper foil layer exposed after the de-smearing. Accordingly, the embodiment may prevent copper migration growth caused by exposure of the filler 112, thereby improving the reliability of the circuit board.

Specifically, referring to (a) of FIG. 2, in the prior art, it was confirmed that the degree of exposure of the filler to the surface of the insulating layer after the de-smearing was great. This is because only one filler group with a specific diameter range is dispersed in the insulating layer in the prior art, resulting in irregularities in the resin flow direction.

Unlike this, referring to (b) of FIG. 2, in the embodiment, it was confirmed that almost no filler is exposed to the surface of the insulating layer 110 after the de-smearing. This is because at least three filler groups with different diameter ranges can be dispersed in the insulating layer 110 to form the direction of the resin flow regularly.

FIG. 3 is a view illustrating a resin coated copper according to a second embodiment.

Referring to FIG. 3, a resin coated copper according to a second embodiment includes an insulating film 210 and a copper foil layer 220 disposed on at least one surface of the insulating film 210. As described in the first embodiment, the insulating film 210 may also be referred to as an insulating layer.

In this case, in the insulating layer 110 according to the first embodiment of FIG. 1, three filler groups having different diameter ranges are dispersed in the resin 111.

Unlike this, in the insulating layer 210 according to the second embodiment of FIG. 3, four filler groups having different diameter ranges may be dispersed in the resin 211. For example, the filler 212 may be divided into four filler groups based on their diameters.

For example, the filler 212 may include a first filler group 212a having a first diameter range, a second filler group 212b having a second diameter range smaller than the first diameter range, a third filler group 212c having a third diameter range smaller than the second diameter range, and a fourth filler group 212d having a fourth diameter range smaller than the third diameter range.

In the insulating layer 210, the filler 212 may be included in a high content. For example, the content of the filler 212 in the insulating layer 210 in the embodiment may be 68 wt % to 76 wt %.

In addition, the first filler group 212a included in the filler 212 may have a first diameter range. The first diameter range may satisfy 2 μm to 3.5 μm.

In addition, the second filler group 212b included in the filler 212 may have a second diameter range. The second diameter range may be 1 μm to 2 μm smaller than the diameter of the filler constituting the first filler group 212a.

In addition, the third filler group 212c included in the filler 212 may have a third diameter range. The third diameter range may satisfy 0.5 μm to 1 μm smaller than the diameter of the filler constituting the second filler group 212b.

In addition, the fourth filler group 212d included in the filler 212 may have a fourth diameter range. The fourth diameter range may satisfy 0.1 μm to 0.5 μm smaller than the diameter of the filler constituting the third filler group 212c.

On the other hand, the filler 212 as described above includes a first filler group 212a, a second filler group 212b, a third filler group 212c, and a fourth filler group 212d, thereby making the flow direction of the resin regular.

In the embodiment, the first filler group 212a may be included in the filler 212 in a range of 1 wt % to 15 wt %. When the content of the first filler group 212a is less than 1 wt %, the insulating layer 210 may not have a certain level of rigidity. In addition, when the content of the first filler group 212a is greater than 15 wt %, a problem of exposing the filler to the surface of the insulating layer 210 can occur due to an increase in the content of the filler 212 in the de-smear process. Accordingly, this may cause migration growth, resulting in a problem of deteriorating reliability.

In addition, in the embodiment, the second filler group 212b is included in the filler 212 while satisfying a range of 50 wt % to 70 wt %. When the content of the second filler group 212b is less than 50 wt %, the insulating layer 210 may not have a certain level of rigidity. In addition, when the content of the second filler group 212b is greater than 70 wt %, the insulating layer 210 may not satisfy the required low dielectric constant.

In addition, in the embodiment, the third filler group 212c is included in the filler 212 while satisfying a range of 15 wt % to 35 wt %. The content of the third filler group 212c may make the flow direction of the resin in the insulating layer 210 regular. In addition, in the embodiment, the fourth filler group 212d is included in the filler 212 while satisfying a range of 5 wt % to 20 wt %.

As described above, the insulating layer 210 according to the second embodiment includes a resin 211 and a filler 212 dispersed in the resin. Further, the filler 212 includes a first filler group 212a having a first diameter, a second filler group 212b having a second diameter smaller than the first diameter, a third filler group 212c having a third diameter smaller than the second diameter, and a fourth filler group 212d having a fourth diameter smaller than the third diameter. The first diameter of the first filler group 212a satisfies the first diameter range, the second diameter of the second filler group 212b satisfies the second diameter range, the third diameter of the third filler group 212c satisfies the third diameter range, and the fourth diameter of the fourth filler group 212d satisfies the fourth diameter range. Accordingly, the embodiment expands the coverage of the resin, thereby minimizing the exposure of the filler 212 to the surface of the insulating layer 210 after the de-smearing to prevent contact with the copper foil layer. Accordingly, the embodiment can prevent migration by minimizing the filler 212 exposed to the surface of the insulating layer 210, thereby improving reliability.

FIG. 4 is a view illustrating a circuit board according to a first embodiment.

Referring to FIG. 4, the circuit board may include an insulating substrate including first to third insulating parts 310, 320, and 330, a circuit pattern 340, and a via 350.

The insulating substrate including the first to third insulating parts 310, 320 and 330 may have a flat plate structure. The insulating substrate may be a printed circuit board (PCB). Here, the insulating substrate may be implemented as a single substrate, or alternatively, may be implemented as a multilayer substrate in which a plurality of insulating layers are successively laminated.

Accordingly, the insulating substrate may include a plurality of insulating parts 310, 320, and 330. As shown in FIG. 4, the plurality of insulating parts includes a first insulating part 310, a second insulating part 320 disposed on the first insulating part 310, and a third insulating part 330 disposed under the first insulating part 310.

In this case, the first insulating part 310, the second insulating part 320, and the third insulating part 330 may be composed of different insulating materials. Preferably, the first insulating part 310 may include glass fibers. In addition, the second insulating part 320 and the third insulating part 330 may not include the glass fiber unlike the first insulating part 310. Preferably, the second insulating part 320 and the third insulating part 330 may include the resin coated copper shown in any one of FIGS. 1 and 3.

Accordingly, a thickness of each insulating layer constituting the first insulating part 310 may be different from a thickness of each insulating layer constituting the second insulating part 320 and the third insulating part 330. In other words, the thickness of each insulating layer constituting the first insulating part 310 may be greater than the thickness of each insulating layer constituting the second insulating part 320 and the third insulating part 330.

That is, the first insulating part 310 includes glass fibers, and the glass fiber generally has a thickness of about 12 μm. Accordingly, the thickness of each insulating layer constituting the first insulating part 310 includes the thickness of the glass fiber and may have a range of 19 μm to 23 μm.

Unlike this, the second insulating part 320 does not include the glass fiber. Preferably, each insulating layer constituting the second insulating part 320 may be made of a resin coated copper (RCC). Specifically, the second insulating part 320 may be formed of an insulating layer included in FIG. 1 or 3.

Accordingly, the thickness of each insulating layer constituting the second insulating part 320 may have a range of 10 μm to 15 μm. Preferably, the thickness of each insulating layer of the second insulating part 320 may be formed within a range not exceeding 15 μm.

In addition, the glass fiber is not included in the third insulating part 330. Preferably, each insulating layer constituting the third insulating part 330 may be made of a resin coated copper (ROC), For example, the third insulating layer 330 may be made of an insulating layer in FIG. 1 or 3.

Accordingly, the thickness of each insulating layer constituting the third insulating part 330 may range from 10 μm to 15 μm. Preferably, the thickness of each insulating layer of the third insulating part 330 may be formed within a range not exceeding 15 μm.

That is, the insulating part constituting the circuit board in the comparative example includes a plurality of insulating layers, and all of the plurality of insulating layers are made of prepreg (PPG) containing glass fibers. In this case, it is difficult to reduce the thickness of the glass fiber in the circuit board in the comparative example based on PPG. This is because, when the thickness of the PPG is reduced, glass fibers included in the PPG can be electrically connected to circuit patterns disposed on the surface of the PPG, resulting in a crack risk. Accordingly, when the thickness of the PPG of the circuit board in the comparative example is reduced, dielectric breakdown and damage to the circuit pattern may occur accordingly. Accordingly, the circuit board in the comparative example had a limitation in reducing the overall thickness due to the thickness of the glass fibers constituting the PPG.

In addition, the printed circuit board in the comparative example has a high dielectric constant because it is composed of an insulating layer made of only PPG containing glass fibers. However, when the dielectric has a high dielectric constant, there is a problem in that it is difficult to approach as a high frequency substitute. That is, since the dielectric constant of the glass fiber is high in the circuit board of the comparative example, a phenomenon in which the dielectric constant is destroyed occurs in a high frequency band.

Accordingly, in the embodiment, the insulating layer is formed using the resin coated copper having a low dielectric constant, thereby reducing the thickness of the circuit board and providing a highly reliable circuit board in which signal loss is minimized even in a high frequency band.

The first insulating part 310 may include a first insulating layer 311, a second insulating layer 312, a third insulating layer 313, and a fourth insulating layer 314 from a lower portion. In addition, each of the first insulating layer 311, the second insulating layer 312, the third insulating layer 313, and the fourth insulating layer 314 may include glass fibers. For example, each of the first insulating layer 311, the second insulating layer 312, the third insulating layer 313, and the fourth insulating layer 314 may include a prepreg.

On the other hand, in the embodiment of the present application, the insulating substrate may be composed of 8 layers based on the insulating layer. However, the embodiment is not limited thereto and a total number of layers of the insulating layer may be increased or decreased.

Also, in the first embodiment, the first insulating part 310 may be composed of four layers. For example, in the first embodiment, the first insulating part 310 may be composed of four layers of prepreg.

In addition, the second insulating part 320 may include a fifth insulating layer 321 and a sixth insulating layer 322 from a lower portion. The fifth insulating layer 321 and the sixth insulating layer 322 constituting the second insulating part 320 may be made of the resin coated copper having a low dielectric constant and a low coefficient of thermal expansion, That is, in the first embodiment, the second insulating part 320 may be composed of two layers. In addition, the fifth insulating layer 321 and the sixth insulating layer 322 constituting the second insulating part 320 in the first embodiment may include the resin coated copper shown in FIG. 1 or 3.

In addition, the third insulating part 330 may include a seventh insulating to layer 331 and an eighth insulating layer 332 from an upper portion. The seventh insulating layer 331 and the eighth insulating layer 332 constituting the third insulating part 330 may be made of the resin coated copper having a low dielectric constant and a low coefficient of thermal expansion. That is, in the first embodiment, the third insulating part 330 may be composed of two layers. For example, in the first embodiment, the third insulating part 330 may be composed of two layers of the resin coated copper.

Meanwhile, in the first embodiment, it has been described that the total number of layers of the insulating layer is eight, the first insulating part 310 formed of prepreg is formed in four layers among the insulating layer, and each of the second insulating part 320 and the third insulating part 330 formed of the resin coated copper has two layers, but it is not limited thereto, and the number of insulating layers constituting the first insulating part 310 may increase or decrease.

Meanwhile, a circuit pattern 340 may be disposed on a surface of an insulating layer constituting each of the first insulating part 310, the second insulating part 320, and the third insulating part 330.

Preferably, the circuit pattern 340 may be disposed on at least one surface of each of the first insulating layer 311, the second insulating layer 312, the third insulating layer 313, the fourth insulating layer 314, the fifth insulating layer 321, the sixth insulating layer 322, the seventh insulating layer 331 and the eighth insulating layer 332. The circuit pattern 340 is a wiring that transmits an electrical signal, and may be formed of a metal material having high electrical conductivity. To this end, the circuit pattern 340 may be formed of at least one metal material selected from gold (Au), silver (Ag), platinum (Pt), titanium (Ti), tin (Sn), copper (Cu), and zinc (Zn).

In addition, the circuit pattern 340 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the circuit pattern 340 may be formed of copper (Cu) having high electrical conductivity and a relatively inexpensive price.

In addition, the circuit pattern 340 may have a thickness of 12 μm±2 μm. That is, the thickness of the circuit pattern 340 may range from 10 μm to 14 μm.

The circuit pattern 340 may be formed by an additive process, a subtractive process, a modified semi additive process (MSAP), and a semi additive process (SAP) process, which are typical circuit board manufacturing processes and a detailed description thereof will be omitted here.

At least one via 350 is formed in at least one of the plurality of insulating layers constituting the first insulating part 310, the second insulating part 320, and the third insulating part 330. The via 350 is disposed penetrating at least one insulating layer among the plurality of insulating layers. The via 350 may pass through only one insulating layer among the plurality of insulating layers, or may be formed to pass through at least two insulating layers in common. Accordingly, the via 350 electrically connect circuit patterns disposed on surfaces of different insulating layers to each other.

The via 350 may be formed by filling an inside of a through hole (not shown) formed in each insulating layer with a conductive material.

The through hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, a chemical containing aminosilane, ketones, or the like may be used. Accordingly, at least one of plurality of insulating layers may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and $CO_2$ laser is a laser that can process only insulating layers.

When the through hole is formed, the via 350 may be formed by filling the inside of the through hole with a conductive material. The metal material forming the via 350 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

FIG. 5 is a view illustrating a circuit board according to a second embodiment, and FIG. 6 is a view illustrating a circuit board according to a third embodiment.

Referring to FIGS. 5 and 6, the circuit board has a difference in the number of layers of the first insulating part composed of PPG and the number of layers of the second insulating part and the third insulating part composed of the resin coated copper in the entire laminated structure of the insulating board.

Referring to FIG. 5, the circuit board in the second embodiment includes a first insulating part 310a, a second insulating part 320a, and a third insulating part 330a.

Also, the first insulating part 310a may include two layers of prepregs 311a and 312a.

In addition, the second insulating part 320a may include three-layer RCCs 321a, 322a, and 323a shown in FIG. 1 or 3.

In addition, the third insulating part 330a may include three-layer RCCs 331a, 332a, and 333a shown in FIG. 1 or 3.

Referring to FIG. 6, the circuit board in the third embodiment may include only one insulating part 310b. Also, the insulating part 310b may have an 8-layer structure.

In addition, the insulating part 310b may include ROCs 311b, 312b, 313b, 314b, 315b, 316b, 317b, and 318b shown in FIG. 1 or 3.

FIG. 7 is a view illustrating a circuit board according to a fourth embodiment.

Referring to FIG. 7, a circuit board 1000 according to a fourth embodiment may include an insulating layer 400 and a circuit pattern 500. For example, the insulating layer 400 includes a first insulating layer 410, a second insulating layer 420 on the first insulating layer 410, a third insulating layer 430 on the second insulating layer 420, a fourth insulating layer 440 on the third insulating layer 430, and a fifth insulating layer 450 on the fourth insulating layer 440.

In this case, the insulating layer 400 in the fourth embodiment may be a resin for a semiconductor package. The insulating layer 400 may include a resin composition for a semiconductor package.

In this case, the resin composition for a semiconductor package of the insulating layer 400 in the fourth embodiment basically includes the features of the insulating layer of at least one embodiment described in FIGS. 1 to 6, and may further include the following features.

For example, the resin composition for a semiconductor package may include a first functional group. In detail, the resin composition for a semiconductor package may include a first functional group that bonds to a second functional group of a circuit pattern described below. This will be described in more detail below.

A resin composition for a semiconductor package forming the insulating layer 400 will be described in detail below.

The circuit pattern 500 may include a buffer layer 550. The buffer layer 550 may be disposed on at least one surface of the circuit pattern 500, That is, the circuit pattern 500 may include a metal layer 530 and a buffer layer 550 disposed on at least one surface of the metal layer 530.

The buffer layer 550 may include a second functional group and a third functional group. Accordingly, the circuit pattern 500 including the buffer layer 550 may include a second functional group and a third functional group.

In detail, the buffer layer 550 may include a second functional group chemically bonded to the first functional group of the insulating layer 400. Adhesion between the insulating layer 400 and the circuit pattern 500 may be improved due to a chemical bond between the first functional group and the second functional group.

In addition, the buffer layer 550 may include a third functional group chemically bonded to the metal layer 530. Adhesion between the insulating layer 400 and the circuit pattern 500 may be improved due to a chemical bond between the third functional group and the metal layer 530.

A pad part may be disposed on upper and lower portions of the circuit board 1000, respectively. In detail, a first pad part 610 may be disposed on an upper portion of the circuit board 1000, and a second pad part 620 may be disposed on a lower portion of the circuit board.

For example, the first pad part 610 may be disposed on the fifth insulating layer 450 which is an uppermost insulating layer of the circuit board 1000. At least one first pad part 610 may be disposed on the fifth insulating layer 450, A part of the first pad parts 310 may serve as patterns for signal transfer, and the other part of the first pad part may serve as an inner lead electrically connected to the electronic component 800 connected to the circuit board 1000 through a solder paste 700 or the like.

Also, the second pad part 620 may be disposed under the first substrate 110 which is a lowermost substrate of the circuit board 1000. Similar to the first pad part 610, the second pad part 620 may serve as a pattern for signal transmission, and may serve as an outer lead for connection with an external substrate.

Meanwhile, the electronic component 500 connected to the circuit board 1000 may include all elements or chips. The element can be divided into an active element and a passive element. The active element is an element that actively uses a non-linear part, and the passive element means a device that does not use a non-linear characteristic even though both linear and non-linear characteristics exist. In addition, the passive element may include transistors, IC semiconductor chips, and the like, and the passive elements may include capacitors, resistors, and inductors. The passive element is mounted on a substrate together with a conventional semiconductor package in order to increase the signal processing speed of a semiconductor chip, which is an active element, or perform a filtering function. In conclusion, the electronic component 500 may include all semiconductor chips, light emitting diode chips, and other driving chips.

As described above, the insulating layer 400 may include a first functional group, and the circuit pattern 500 may include a second functional group and a third functional group. The insulating layer 400 may include a resin composition for a semiconductor package. In detail, the resin composition for a semiconductor package may include a resin composition for a semiconductor package including an epoxy resin. That is, the insulating layer 400 may be formed by curing the resin composition for a semiconductor package.

The epoxy resin may include a crystalline epoxy resin, an amorphous epoxy resin, and a mixed epoxy resin obtained by mixing them. For example, the epoxy resin is bisphenol A, 3,3,5,5'-tetramethyl-4,4'-dihydroxydiphenylmethane, 4,4'-dihydroxydiphenylsulfone, 4,4'-dihydroxydiphenyl sulfide, 4,4'-dihydroxydiphenyl ketone, fluorene bisphenol, 4,4'-biphenol, 3,3',5,5'-tetramethyl-4,4'-dihydroxybiphenyl, 2,2'-biphenol, resorcin, catechol, t-butylcatechol, hydroquinone, t-butylhydroquinone, 1,2-dihydroxynaphthalene, 1,3-di Hydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, divalent phenols such as allylated or polyallylated dihydroxynaphthalene, allylated bisphenol A, allylated bisphenol F, and allylated phenol novolac; or trivalent or higher phenols such as phenol novolac, bisphenol A novolac, o-cresol novolac, m-cresol novolac, p-cresol novolak, xylenol novolac, poly-p-hydroxystyrene, tris-(4-hydroxyphenyl)methane, 1,1,2,2-tetrakis (4-hydroxyphenyl) ethane, fluoroglycinol, pyrogallol, t-butylpyrogallol, allylated pyrogallol, polyallylated pyrogallol, 1,2,4-benzenetriol, 2,3,4-trihydroxybenzophenone, phenol aralkyl resin, naphthol aralkyl resin, dicyclopentadiene-based resin, or an epoxy resin such as glycidyl ether derived from halogenated bisphenols such as tetrabromobisphenol A, but the embodiment is not limited thereto. The epoxy resin may be included in an amount of 3 wt % to 60 wt % based on a total amount of the resin composition for a semiconductor package.

The resin composition for a semiconductor package may further include an additive agent. In detail, the resin composition for a semiconductor package may include an additive agent including a first functional group. In detail, the additive agent may include a first functional group that bonds to the second functional group. In detail, the additive agent may include a first functional group chemically bonded to the second functional group of the buffer layer 550. For example, the first functional group may be chemically bonded to the second functional group through a condensation reaction. For example, the additive agent may include a material represented by the following chemical formula.

[chemical formula]

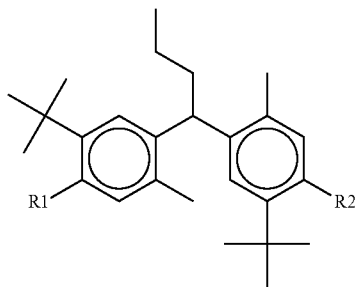

(Here, R1 and R2 include at least one of COOH, NH$_2$, OH, OCl, OBr, etc.)

The resin composition for semiconductor packaging may include the additive agent, and thus, the epoxy resin substrate formed by the resin composition for a semiconductor package may have a first functional group. Accordingly, the embodiment may improve adhesion with the circuit pattern 500 disposed on the insulating layer 400. That is, adhesion between the insulating layer 400 and the circuit pattern 500 may be improved by chemically bonding the first functional group with the second functional group through a condensation reaction.

The additive agent may be dissolved in a solvent and added in the resin composition for a semiconductor package.

In detail, the additive agent may be dissolved in a solvent including ethanol, methanol, acetonitrile, acetone, dimethyl sulfoxide, dimethylformamide or acetic acid and added in the resin composition for a semiconductor package.

The additive agent may be included in a smaller wt % than the epoxy resin. In detail, the additive agent may be included in wt % of 10% or less based on wt % of the epoxy resin. In detail, the additive agent may be included in an amount of 1% to 10% based on wt % of the epoxy resin. In more detail, the additive agent may be included in an amount of 1% to 5% based on wt % of the epoxy resin.

When the additive agent is included in an amount of less than 1% with respect to the wt % of the epoxy resin, the number of the first functional group in the resin composition for a semiconductor package is small, so that adhesion between the substrate and the circuit pattern cannot be effectively improved.

In addition, when the additive agent is included in an amount of more than 10% with respect to the wt % of the epoxy resin, the overall dielectric constant of the substrate formed by the resin composition for the semiconductor package increases, thereby increasing the loss of high-frequency electronic signals and degrading the characteristics of the circuit board.

The resin composition for a semiconductor package may further include a curing agent. In detail, the resin composition for a semiconductor package may include an amine-based curing agent. For example, the resin composition for semiconductor packaging may be aliphatic amines, polyether polyamines, alicyclic amines, aromatic amines, and the like. Aliphatic amines may include ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxy oxyethylethylenediamine, tetra(hydroxyethyl)ethylenediamine and the like. Polyether polyamines may include triethylene glycol diamine, tetraethylene glycol diamine, diethylene glycol bis (propylamine), polyoxypropylene diamine, polyoxypropylene triamine and the like. Alicyclic amines may contain an amine-based curing agent such as isophoronediamine, metacendiamine, N-aminoethylpiperazine, bis(4-amino-3-methyldicyclohexyl)methane, bis(aminomethyl)cyclohexane, 3,9-bis(3-aminopropyl)2,4,8,10-tetraoxaspiro(5,5)undecane, norbornenediamine and the like. Aromatic amines may include tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diamino Diphenylmethane, 4,4'-diaminodiphenylmethane, 4,4'-diamino-1,2-diphenylethane, 2,4-diaminodiphenylsulfone, 4,4'-diaminodiphenyl Sulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl) ethylamine, diaminodiethyldimethyldiphenylmethane, α,α'-bis(4-aminophenyl)-p-diisopropylbenzene.

However, the embodiment is not limited thereto, and the resin composition for a semiconductor package may include a phenol-based curing agent, an acid anhydride-based curing agent, a polymercaptan-based curing agent, a polyaminoamide-based curing agent, and an isocyanate-based curing agent in addition to an amine-based curing agent, agent, a block isocyanate-based curing agent, and the like. The compounding amount of the curing agent can be appropriately set in consideration of the type of curing agent to be compounded and properties of an obtained thermally conductive epoxy resin molded body.

The curing agent may be included in an amount of 0.5 wt % to 5 wt % based on a total weight of the resin composition for a semiconductor package.

The circuit pattern 500 may include a metal layer 530 and a buffer layer 550. The buffer layer 550 may be disposed on at least one surface of the metal layer 530. In detail, the buffer layer 550 may be disposed on a surface where the metal layer 530 and the insulating layer 400 face each other. That is, the buffer layer 550 may be disposed on an adhesive surface of the metal layer 530.

Alternatively, the buffer layer 550 may be disposed on an entire surface of the metal layer 530.

The buffer layer 550 may be formed to a thickness smaller than a thickness of the metal layer 530. In detail, the buffer layer 550 may be formed to a thin film thickness. In detail, the buffer layer 550 may be formed to a thickness of 500 nm or less. In more detail, the buffer layer 550 may be formed to a thickness of 5 nm to 500 nm.

When the thickness of the buffer layer 550 is less than 5 nm, the thickness of the buffer layer is too thin to sufficiently improve adhesion through the buffer layer 550. In addition, when the thickness of the buffer layer is formed to exceed 500 nm, the adhesion enhancement effect according to the thickness is small, so the overall thickness of the circuit board can be increased, and a transmission signal loss of the circuit board may increase as the dielectric constant of the substrate increases, and thus characteristics of the circuit board may be reduced.

The buffer layer 550 may include a plurality of elements. A plurality of elements included in the buffer layer 550 are combined with each other in the buffer layer and included in molecular or ionic form, and the molecules, the molecules, and the ions may be chemically bonded to each other to form a buffer layer.

The buffer layer 550 may include at least one of a carbon element, a nitrogen element, an oxygen element, a silicon element, a sulfur element, and a metal element. In detail, the buffer layer 550 may include all of a carbon element, a nitrogen element, an oxygen element, a silicon element, a sulfur element, and a metal element.

The carbon element, nitrogen element, oxygen element, silicon element, sulfur element, and metal element may be present in a molecular form by bonding to each other in the buffer layer, or may exist in an ionic form alone.

Among the plurality of elements, the oxygen element, the carbon element, and the nitrogen element may be related to a functional group of the buffer layer coupled to the substrate. That is, a functional group formed by molecules including the oxygen element, the carbon element, the nitrogen atom, and the like may be chemically bonded to the substrate.

In addition, the carbon element, the nitrogen element, the silicon element, and the sulfur element among the plurality of elements may be related to a functional group of the buffer layer coupled to the circuit pattern. That is, a functional group formed by molecules including the carbon element, the nitrogen element, the silicon element, the sulfur element, etc. may be chemically bonded to the substrate and the metal layer.

In addition, the metal element may combine molecules formed by the carbon element, nitrogen element, oxygen element, silicon element, and sulfur element to each other. That is, molecules formed by the carbon element, nitrogen element, oxygen element, silicon element, and sulfur element may be chemically combined through the metal element to form a buffer layer. That is, the metal element may be disposed between the molecules to serve as a medium for chemically bonding the molecules.

To this end, the carbon element, nitrogen element, oxygen element, silicon element, sulfur element, and metal element may be included in a constant mass ratio. In detail, the metal element among the plurality of elements may be included the most than other elements, and the carbon element, nitrogen element, oxygen element, silicon element, and sulfur element may each be included in a constant mass ratio based on the metal element.

Specifically, the ratio of the carbon element to the metal element ((carbon element/copper element)*100) may be 5 to 7. In addition, the ratio of the nitrogen element to the metal element ((nitrogen element/copper element)*100) may be 1.5 to 7. In addition, the ratio of the oxygen element to the metal element ((oxygen element/copper element)*100) may be 1.1 to 1.9. In addition, the ratio of the silicon element to the metal element ((silicon element/copper element)*100) may be 0.5 to 0.9. In addition, the ratio of the sulfur element to the metal element ((sulfur element/copper element)*100) may be 0.5 to 1.5. A ratio of the carbon element, nitrogen element, oxygen element, silicon element, and sulfur element to the metal element may be related to a bonding strength of the substrate and the metal layer. In detail, when the ratio of the carbon element to the metal element ((carbon element/copper element)*100) is out of the range of 5 to 7, the bonding force between the buffer layer and the substrate or the metal layer may be weakened. In addition, when the ratio of the nitrogen element to the metal element ((nitrogen element/copper element)*100) is out of the range of 1.5 to 7, the bonding force between the buffer layer and the substrate or the metal layer may be weakened. In addition, when the ratio of the oxygen element to the metal element ((oxygen element/copper element)*100) is out of the range of 1.1 to 1.9, the bonding force between the buffer layer and the substrate or the metal layer may be weakened. In addition, when the ratio of the silicon element to the metal element ((silicon element/copper element)*100) is out of the range of 0.5 to 0.9, the bonding force between the buffer layer and the substrate or the metal layer may be weakened.

In addition, when the ratio of the sulfur element to the metal element ((sulfur element sulfur/copper element)*100) is out of the range of 0.5 to 1.5, the bonding force between the buffer layer and the substrate or the metal layer may be weakened.

Meanwhile, the carbon element, nitrogen element, oxygen element, silicon element, sulfur element, and metal element exist in the form of molecules or ions in the buffer layer, and the molecules and the ions may be connected to each other by bonding. In detail, the buffer layer 550 may include molecules and metal ions formed by the carbon element, nitrogen element, oxygen element, silicon element, sulfur element, and metal elements. The molecules included in the buffer layer 550 may include at least two types of molecules depending on the size of the molecule or the size of the molecular weight. In detail, the molecule may include macromolecule and unimolecule. The macromolecule, the unimolecule, and the metal ion may be formed in a structure in which they are bonded to each other in the buffer layer. In detail, the macromolecule, the unimolecule, and the metal ion may be chemically bonded through covalent bonds and coordination bonds in the buffer layer to form a structure in which they are connected to each other. The metal ion may connect the macromolecules, the unimolecules, or the macromolecule and the unimolecules to each other. In detail, the macro molecules, the unimolecules, or the macromolecule and the unimolecule are coordinate bonded with the metal ion, and accordingly, the macromolecules, the unimolecule, or the macromolecule and the unimolecule can be chemically bound.

The metal ions may include the same material as the metal layer. Alternatively, the metal ion may include a material different from a material of the metal layer. For example, when the metal layer includes copper, the metal ions may include copper or a metal other than copper. In detail, the metal ions may be formed by the metal layer. In detail, metal ions may be formed by ionizing the circuit pattern including metal using a separate oxidizing agent. Accordingly, the ionized metal ions may form a buffer layer by coordinating the macro molecules and the unimolecules in the buffer layer to connect the molecules to each other.

Alternatively, a metal ion may be separately added when the buffer layer is formed, and the metal ion may form a buffer layer by coordinating the macro molecule and the single molecule in the buffer layer to connect the molecules to each other. In this case, the separately added metal ions may be the same as or different from the metal of the metal layer.

The macromolecule and the unimolecule may include at least one of the carbon element, nitrogen element, oxygen element, silicon element, and sulfur element. That is, the macromolecule and the unimolecule may be molecules including at least one of the carbon element, nitrogen element, oxygen element, silicon element, and sulfur element. In detail, the macromolecule may include a molecule including the carbon element and the nitrogen element. In detail, the macromolecule may include an azole group including the carbon element and the nitrogen element.

In addition, the macromolecule may include a molecule including the silicon c element. In detail, the macro molecule may include a silane group including the silicon element.

In addition, the unimolecule may include the carbon element, the nitrogen element, and the sulfur element. That is, the unimolecule may be a molecule including the carbon element, the nitrogen element, and the sulfur element. For example, the unimolecule may include an SCN group to which a thiocyanate group (—SCN) is connected.

The buffer layer 550 may include a second functional group and a third functional group. In detail, the buffer layer 550 includes a second functional group chemically bonded to the insulating layer 400 and a third functional group chemically bonded to the metal layer 530 of the circuit pattern 230 through a coordination bond.

That is, the macromolecules and the unimolecules may include a plurality of terminal groups that are chemically bonded to the substrate and the metal layer, that is, functional groups. The substrate and the metal layer are chemically firmly bonded by the buffer layer due to these functional groups, so that adhesion between the substrate and the circuit pattern can be improved.

The first functional group and the second functional group may be defined as end groups of the buffer layer connected to one of the macromolecule, the monoatom, or the metal atom.

The second functional group may include a hydroxy group (—OH). Accordingly, the second functional group may be chemically bonded to the first functional group of the insulating layer 400 through a condensation reaction.

In addition, the third functional group may be bonded to the metal layer 530 through a coordination bond. The third functional group may include functional groups coordinated with the metal layer 530. In detail, the third functional group may include a Si group and a thiocyanate group (—SCN) of silane groups.

The second functional group and the third functional group included in the buffer layer may be chemically bonded to the substrate and the metal layer, respectively. Accordingly, adhesion between the circuit pattern and the substrate that is a heterogeneous material may be improved by the buffer layer disposed between the substrate and the metal layer.

Fourth Embodiment

A resin composition for semiconductor packaging was formed by mixing and stirring an epoxy resin, an additive agent, and a curing agent.

In this case, the additive agent represented by Formula 1 below was added to the additive agent.

[Formula 1]

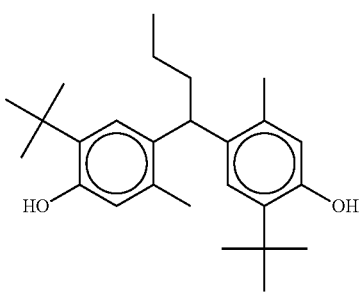

In addition, the additive agent was included in 1.5% of the wt % of the epoxy resin.

Subsequently, a substrate for a circuit board was prepared by applying heat to the resin composition for a semiconductor package.

Subsequently, a circuit board was manufactured by patterning a copper layer on the insulating layer to form a circuit pattern.

At this time, a buffer layer containing carbon, nitrogen, oxygen, silicon, sulfur, and metal elements was formed on a surface of the copper layer facing the substrate.

At this time, the buffer layer includes a second functional group including a hydroxy group (—OH) and a third functional group including a Si group of a silane group and a thiocyanate group (—SCN).

Subsequently, adhesion evaluation and reliability evaluation between the substrate and the circuit pattern were performed. To evaluate the adhesion between the substrate and the circuit pattern, the UTM 90° Peel value was measured using UTM equipment. In addition, reliability evaluation was evaluated as NG when the peel strength (kgf/cm) of the circuit pattern was less than 0.6.

COMPARATIVE EXAMPLE

A substrate for a circuit board was prepared by applying heat to the resin composition for a semiconductor package in the same manner as in the embodiment, except that the resin composition for a semiconductor package did not contain an additive agent.

Next, after patterning a copper layer on the insulating layer to form a circuit pattern to manufacture a circuit board, adhesion evaluation and reliability evaluation between the insulating layer and the circuit pattern were performed.

TABLE 3

| | | | Fourth embodiment | Comparative example |
|---|---|---|---|---|
| dielectric constant | | Dk | 3.0 | 3.0 |
| | | Dy | 0.0032 | 0.0029 |
| coefficient of thermal expansion (ppm/° C.) | XY | $\alpha 1 (<Tg)$ | 36 | 42 |
| | | $\alpha 2 (>Tg)$ | 116 | 120 |
| Glass transition temperature (° C.) | | | 228 | 230 |
| storage modulus (GPa at 25° C.) | | | 6.1 | 5.6 |
| peel strength (kgf/cm) | | | 0.65 | 0.51 |

Referring to FIG. 8, it may be seen that the compositions of the epoxy resins of the resin compositions for semiconductor packages according to the embodiment and the comparative example are similar. However, referring to FIG. 9, it may be seen that the resin composition for a semiconductor package according the embodiment and the comparative example has different types of additive agents.

That is, referring to FIG. 9, the resin composition for a semiconductor package according to the embodiment comprises an additive agent represented by Chemical Formula 1 having a first functional group in the A peak and an ethanol solvent for dissolving the additive agent in the B peak.

Due to this difference, the characteristics of the substrate formed by the resin composition for the semiconductor package according to the fourth embodiment and the comparative example may be changed.

Referring to Table 3, it can be seen that the substrate formed by the resin composition for the semiconductor package according to the fourth embodiment and the substrate formed by the resin composition for the semiconductor package according to the comparative example are almost similar in terms of the dielectric constant.

That is, since the resin composition for a semiconductor package according to the fourth embodiment can implement a low dielectric constant even by adding an additive agent, it can be seen that it can be applied to a circuit board for high-frequency electronic signals.

In addition, it can be seen that the substrate formed by the resin composition for the semiconductor package according to the fourth embodiment and the substrate formed by the resin composition for the semiconductor package according to the comparative example are almost similar in terms of the coefficient of thermal expansion and the glass transition temperature.

That is, it can be seen that the resin composition for a semiconductor package according to the fourth embodiment can maintain heat resistance even by adding an additive agent.

In addition, it can be seen that the substrate formed by the resin composition for the semiconductor package according to the fourth embodiment has an improved storage modulus compared to the substrate formed by the resin composition for the semiconductor package according to the comparative example.

That is, it can be seen that the resin composition for a semiconductor package according to the fourth embodiment has improved durability by adding an additive agent.

In addition, it can be seen that the circuit board including the substrate formed by the resin composition for the semiconductor package according to the fourth embodiment has improved peel strength compared to the circuit board including the substrate formed by the resin composition for the semiconductor package according to the comparative example.

That is, it can be seen that the circuit board including the substrate formed by the resin composition for a semiconductor package according to the fourth embodiment can improve the adhesion between the substrate and the circuit pattern, thereby improving the reliability of the circuit board.

The embodiment provides a resin composition for a semiconductor package constituting an insulating layer or an insulating film, which is a composite of resin and filler. In this case, the filler of the embodiment may include at least three filler groups having different diameter ranges. Accordingly, the embodiment can expand the resin coverage by diversifying the filler size, and it may minimize contact between the filler and the metal layer. In addition, the embodiment can prevent a migration phenomenon by minimizing contact between the filler and the metal layer, thereby improving reliability.

Accordingly, the embodiment may allow to provide an insulating layer using a resin coated copper having a low dielectric constant, and accordingly, it is possible to provide a highly reliable circuit board in which signal loss is minimized even in a high frequency band while reducing the thickness of the circuit board.

In addition, the resin composition for the semiconductor package of the embodiment forms a substrate applied to a circuit board, and the substrate formed by the resin composition for the semiconductor package may include a first functional group. In addition, the circuit pattern disposed on the substrate includes a metal layer and a buffer layer, and the buffer layer may include a second functional group and a third functional group that bond with the substrate and the metal layer.

Accordingly, the first functional group of the substrate and the second functional group of the buffer layer are chemically bonded through a condensation reaction, and the third functional group of the buffer layer may be chemically bonded to a metal of the metal layer through a coordination bond. Accordingly, the substrate and the buffer layer are chemically bonded through a covalent bond, and the buffer layer and the metal layer may be chemically bonded through a coordination bond, thereby improving adhesion between the substrate and the circuit pattern of the circuit board. In addition, even if an additive agent having the first functional group is introduced into a resin composition for a semiconductor package in order to introduce the first functional group, the substrate can have a low dielectric constant, so that the circuit board according to the embodiment may be applied to a high-frequency electronic signal. In addition, even if an additive agent having the first functional group is introduced into a resin composition for a semiconductor package to introduce the first functional group, since the coefficient of thermal expansion and glass transition temperature of the substrate are maintained, the heat resistance of the circuit board can be maintained. In addition, when an additive agent having the first functional group is introduced into the resin composition for a semiconductor package in order to introduce the first functional group, it is possible to improve the durability of the board and improve the reliability of the circuit board.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

What is claimed is:

1. A resin composition for a semiconductor package, comprising:
   an insulating layer comprising a resin composition that is a composite of a resin and a filler disposed in the resin,
   wherein the filler has a content in a range of 68 wt % to 76 wt % in the resin composition,
   wherein the filler includes first to third filler groups having different diameters,
   wherein a diameter of the second filler group is smaller than a diameter of the first filler group and greater than a diameter of the third filler group,
   wherein a content of the second filler group is greater than a content of each of the first and third filler groups,
   wherein the diameter of the first filler group satisfies a range of 2 μm to 3.5 μm,
   wherein the diameter of the second filler group satisfies a range of 1 μm to 2 μm,
   wherein the diameter of the third filler group satisfies a range of 0.5 μm to 1 μm, and
   wherein the insulating layer has a dielectric constant of 2.9 to 3.2 Dk.

2. The resin composition of claim 1, wherein the diameter of the third filler group is smaller than the diameter of the first filler group, and
wherein the content of the third filler group is greater than the content of the first filler group.

3. The resin composition of claim 2, wherein the content of the first filler group satisfies a range of 5 wt % to 20 wt %,
wherein the content of the second filler group satisfies a range of 60 wt % to 80 wt %, and
wherein the content of the third filler group satisfies a range of 10 wt % to 30 wt %.

4. The resin composition of claim 1, wherein the filler further includes a fourth filler group having a smaller diameter than the diameter of the third filler group.

5. The resin composition of claim 4, wherein the diameter of the fourth filler group satisfies a range of 0.1 μm to 0.5 μm.

6. The resin composition of claim 4, wherein the content of the first filler group satisfies a range of 1 wt % to 15 wt %,
wherein the content of the second filler group satisfies a range of 50 wt % to 70 wt %,
wherein the content of the third filler group satisfies a range of 15 wt % to 35 wt %, and
wherein a content of the fourth filler group satisfies a range of 5 wt % to 20 wt %.

7. The resin composition of claim 1, wherein a dielectric constant of the resin composition has a range between 2.9 and 3.2 by a combination of the resin and the filler.

8. A resin coated copper (RCC) comprising:
an insulating layer; and
a copper foil layer coated on at least one surface of the insulating layer,
wherein the insulating layer includes a resin and a filler,
wherein the filler includes first to third filler groups having different diameters,
wherein a diameter of the second filler group is smaller than a diameter of the first filler group and greater than a diameter of the third filler group,
wherein a content of the second filler group is greater than a content of each of the first and third filler groups,
wherein the diameter of the first filler group satisfies a range of 2 μm to 3.5 μm,
wherein the diameter of the second filler group satisfies a range of 1 μm to 2 μm,
wherein the diameter of the third filler group satisfies a range of 0.5 μm to 1 μm, and
wherein the insulating layer has a dielectric constant of 2.9 to 3.2 Dk.

9. The RCC of claim 8, wherein the diameter of the third filler group is smaller than the diameter of the first filler group, and
wherein the content of the third filler group is greater than the content of the first filler group.

10. The RCC of claim 9, wherein the content of the first filler group satisfies a range of 5 wt % to 20 wt %,
wherein the content of the second filler group satisfies a range of 60 wt % to 80 wt %, and
wherein the content of the third filler group satisfies a range of 10 wt % to 30 wt %.

11. The RCC of claim 8, wherein the filler further includes a fourth filler group having a smaller diameter than the diameter of the third filler group, and
wherein the diameter of the fourth filler group satisfies a range of 0.1 μm to 0.5 μm.

12. The RCC of claim 11, wherein the content of the first filler group satisfies a range of 1 wt % to 15 wt %,
wherein the content of the second filler group satisfies a range of 50 wt % to 70 wt %,
wherein the content of the third filler group satisfies a range of 15 wt % to 35 wt %, and
wherein a content of the fourth filler group satisfies a range of 5 wt % to 20 wt %.

13. A circuit board comprising:
an insulating layer;
a circuit pattern disposed on the insulating layer; and
a via passing through the insulating layer,
wherein the insulating layer includes a resin and a filler,
wherein the filler includes first to third filler groups having different diameters,
wherein a diameter of the second filler group is smaller than a diameter of the first filler group and greater than a diameter of the third filler group,
wherein a content of the second filler group is greater than a content of each of the first and third filler groups,
wherein the diameter of the first filler group satisfies a range of 2 μm to 3.5 μm,
wherein the diameter of the second filler group satisfies a range of 1 μm to 2 μm,
wherein the diameter of the third filler group satisfies a range of 0.5 μm to 1 μm, and
wherein the insulating layer has a dielectric constant of 2.9 to 3.2 Dk.

14. The circuit board of claim 13, wherein the diameter of the third filler group is smaller than the diameter of the first filler group, and
wherein the content of the third filler group is greater than the content of the first filler group.

15. The circuit board of claim 14, wherein the content of the first filler group satisfies a range of 5 wt % to 20 wt %,
wherein the content of the second filler group satisfies a range of 60 wt % to 80 wt %, and
wherein the content of the third filler group satisfies a range of 10 wt % to 30 wt %.

16. The circuit board of claim 13, wherein the filler further includes a fourth filler group having a smaller diameter than the diameter of the third filler group, and
wherein the diameter of the fourth filler group satisfies a range of 0.1 μm to 0.5 μm.

17. The circuit board of claim 16, wherein the content of the first filler group satisfies a range of 1 wt % to 15 wt %,
wherein the content of the second filler group satisfies a range of 50 wt % to 70 wt %,
wherein the content of the third filler group satisfies a range of 15 wt % to 35 wt %, and
wherein a content of the fourth filler group satisfies a range of 5 wt % to 20 wt %.

* * * * *